US009582050B2

(12) United States Patent
Tseng et al.

(10) Patent No.: US 9,582,050 B2
(45) Date of Patent: Feb. 28, 2017

(54) INSTALLATION MECHANISM FOR REPLACEABLE DEVICE AND ELECTRONIC APPARATUS THEREWITH

(71) Applicant: Wistron Corporation, New Taipei (TW)

(72) Inventors: Tien-Chung Tseng, New Taipei (TW); Wei-Yi Lee, New Taipei (TW)

(73) Assignee: Wistron Corporation, New Taipei (TW)

( * ) Notice: Subject to any disclaimer, the term of this patent is extended or adjusted under 35 U.S.C. 154(b) by 137 days.

(21) Appl. No.: 14/585,198

(22) Filed: Dec. 30, 2014

(65) Prior Publication Data

US 2016/0073537 A1 Mar. 10, 2016

(30) Foreign Application Priority Data

Sep. 4, 2014 (TW) .............................. 103130629 A

(51) Int. Cl.
*H05K 5/00* (2006.01)
*G06F 1/18* (2006.01)
(Continued)

(52) U.S. Cl.
CPC ............. *G06F 1/187* (2013.01); *G06F 1/1658* (2013.01); *G06F 1/183* (2013.01);
(Continued)

(58) Field of Classification Search
CPC ........ G06F 1/187; G06F 1/183; G06F 1/1658; H01R 13/62938; H01R 13/62905; H05K 5/0221; H05K 5/023; H05K 7/1411; H05K 7/1409
(Continued)

(56) References Cited

U.S. PATENT DOCUMENTS

| 7,417,866 B1* | 8/2008 | Beseth ................. H05K 7/1409 361/728 |
| 2006/0171110 A1* | 8/2006 | Li ........................... G06F 1/184 361/679.37 |

(Continued)

FOREIGN PATENT DOCUMENTS

| TW | M401971 U1 | 4/2011 |
| TW | I369935 | 8/2012 |
| TW | M472932 U | 2/2014 |

OTHER PUBLICATIONS

Office action mailed on Jun. 22, 2015 for the Taiwan application No. 103130629, filing date: Sep. 4, 2014, p. 1 line 13-14, p. 2-3 and p. 4 line 1-3.

*Primary Examiner* — James Wu
(74) *Attorney, Agent, or Firm* — Winston Hsu; Scott Margo

(57) ABSTRACT

An electronic apparatus includes a replaceable device, an apparatus casing, a supporting structure, an abutting structure, and a removable carrier. The supporting structure, the abutting structure, and the removable carrier function as an installation mechanism for installing the replaceable device into the apparatus casing. The supporting structure and the abutting structure are disposed in the apparatus casing. The abutting structure has two side walls oppositely disposed. The removable carrier includes a fixing frame and an actuation part pivotally connected to the fixing frame. The replaceable device is fixed on the fixing frame. When the removable carrier is disposed on the supporting structure, the actuation part can be rotated relative to the fixing frame and alternatively abut against one side wall so that the fixing frame moves on the supporting structure and a connector of the replaceable device is engaged with or disengaged from a connector of the electronic apparatus respectively.

18 Claims, 8 Drawing Sheets

(51) Int. Cl.
  *G06F 1/16* (2006.01)
  *H05K 7/14* (2006.01)
  *H01R 13/629* (2006.01)
  *H05K 5/02* (2006.01)

(52) U.S. Cl.
  CPC ........ *H01R 13/62938* (2013.01); *H05K 5/023* (2013.01); *H05K 7/1411* (2013.01)

(58) Field of Classification Search
  USPC ............ 361/679.37, 679.39, 679.58, 679.59, 752,361/756, 787, 797, 801, 802, 809, 810; 439/157, 296, 836
  See application file for complete search history.

(56) References Cited

U.S. PATENT DOCUMENTS

| | | | |
|---|---|---|---|
| 2013/0252447 A1* | 9/2013 | Mau | G06F 1/187 439/160 |
| 2014/0070682 A1* | 3/2014 | Dunham | G06F 1/183 312/244 |

\* cited by examiner

INSTALLATION MECHANISM FOR REPLACEABLE DEVICE AND ELECTRONIC APPARATUS THEREWITH

BACKGROUND OF THE INVENTION

1. Field of the Invention

The disclosure relates to an installation mechanism for a replaceable device and an electronic apparatus, and especially relates to an installation mechanism having a removable carrier, and an electronic apparatus with the installation mechanism.

2. Description of the Prior Art

Conventional electronic equipment is usually provided with replaceable electronic components, such as hard drives in a computer host, which a user can install, replace, or remove on request. For example, in an installation of a hard drive, it is needed to engage a connector of the hard drive with a connector in the computer host. The user needs to push the hard drive by hand in a force exceeding a resistance force during an engagement of the connectors, so that the connectors can be engaged completely. However, during the engagement of the connectors, the resistance force during the engagement is inconstant so that the user probably pushes the hard drive excessively. In the last stage of the engagement, the hard drive may be moved at a certain velocity leading to an impact on the hard drive and the connectors, or the user keeps pushing the hard drive due to an uncertain state of the engagement, leading to damage to the hard drive and the connectors. During a disengagement of the connectors, the user needs to pull the hard drive in a force exceeding a resistance force during the disengagement, so that the connectors can be disengaged completely. Similarly, the resistance force during the disengagement is inconstant so that the user probably pulls the hard drive excessively. The hard drive moves at a certain velocity after the connectors are disengaged, and probably hits other components or structures in the computer host leading to damage to the hard drive. In addition, for a smooth engagement and disengagement of the connectors of the hard drive and the computer host, the user usually pushes or pulls the hard drive with his hands, leading to an inconvenience to the engagement and disengagement.

SUMMARY OF THE INVENTION

An objective of the disclosure is to provide an installation mechanism for removably installing a replaceable device to an apparatus casing. By the installation mechanism, a user can install the replaceable device to the apparatus casing smoothly without using his hands, which avoids damage during the installation and applying an excessive force to the replaceable device.

The installation mechanism of the disclosure includes a supporting structure, an abutting structure, and a removable carrier. The supporting structure is disposed in the apparatus casing and includes a sliding engagement structure. The abutting structure is disposed in the apparatus casing and has a first side wall and a second side wall oppositely disposed. The removable carrier includes a fixing frame and an actuation part. The replaceable device is fixed on the fixing frame. The actuation part includes a sliding portion, a pivotal connection portion, and a manipulation portion. The actuation part is connected to the fixing frame through the pivotal connection portion. The manipulation portion is operable to rotate the actuation part relative to the fixing frame so that the sliding portion alternatively slides against the first side wall so that the fixing frame slides on the supporting structure in a first direction through the sliding engagement structure, or slides against the second side wall so that the fixing frame slides on the supporting structure in a second direction, parallel to the first direction, through the sliding engagement structure. Thereby, the user can rotate the actuation part by one hand to move the fixing frame with the replaceable device smoothly, leading to the achievement of installing or detaching the replaceable device in or from the apparatus casing.

Another objective of the disclosure is to provide an electronic apparatus having the installation mechanism of the disclosure, by which a user can smoothly and removably install a replaceable device to the electronic apparatus, which avoids damage during the installation and applying an excessive force to the replaceable device.

The electronic apparatus of the disclosure includes an apparatus casing, a supporting structure, an abutting structure, a removable carrier, and a replaceable device. The apparatus casing has an accommodating space. The supporting structure and the abutting structure are disposed in the accommodating space. The replaceable device is disposed on the removable carrier and installed in the apparatus casing through the removable carrier. Therein, the replaceable device includes a first connector. The electronic apparatus includes a second connector disposed in the accommodating space. When the replaceable device is installed in the apparatus casing, the first connector is engaged with the second connector. Further, the supporting structure includes a sliding engagement structure. The abutting structure has a first side wall and a second side wall oppositely disposed. The removable carrier includes a fixing frame and an actuation part. The replaceable device is fixed on the fixing frame. The actuation part includes a sliding portion, a pivotal connection portion, and a manipulation portion. The actuation part is connected to the fixing frame through the pivotal connection portion. The manipulation portion is operable to rotate the actuation part relative to the fixing frame so that the sliding portion alternatively slides against the first side wall so that the fixing frame slides on the supporting structure in a first direction through the sliding engagement structure and the first connector is engaged with the second connector, or slides against the second side wall so that the fixing frame slides on the supporting structure in a second direction through the sliding engagement structure and the first connector is disengaged from the second connector. Therein, the second direction is parallel to the first direction. Thereby, the user can rotate the actuation part by one hand to move the fixing frame with the replaceable device smoothly, leading to the achievement of installing or detaching the replaceable device in or from the apparatus casing.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
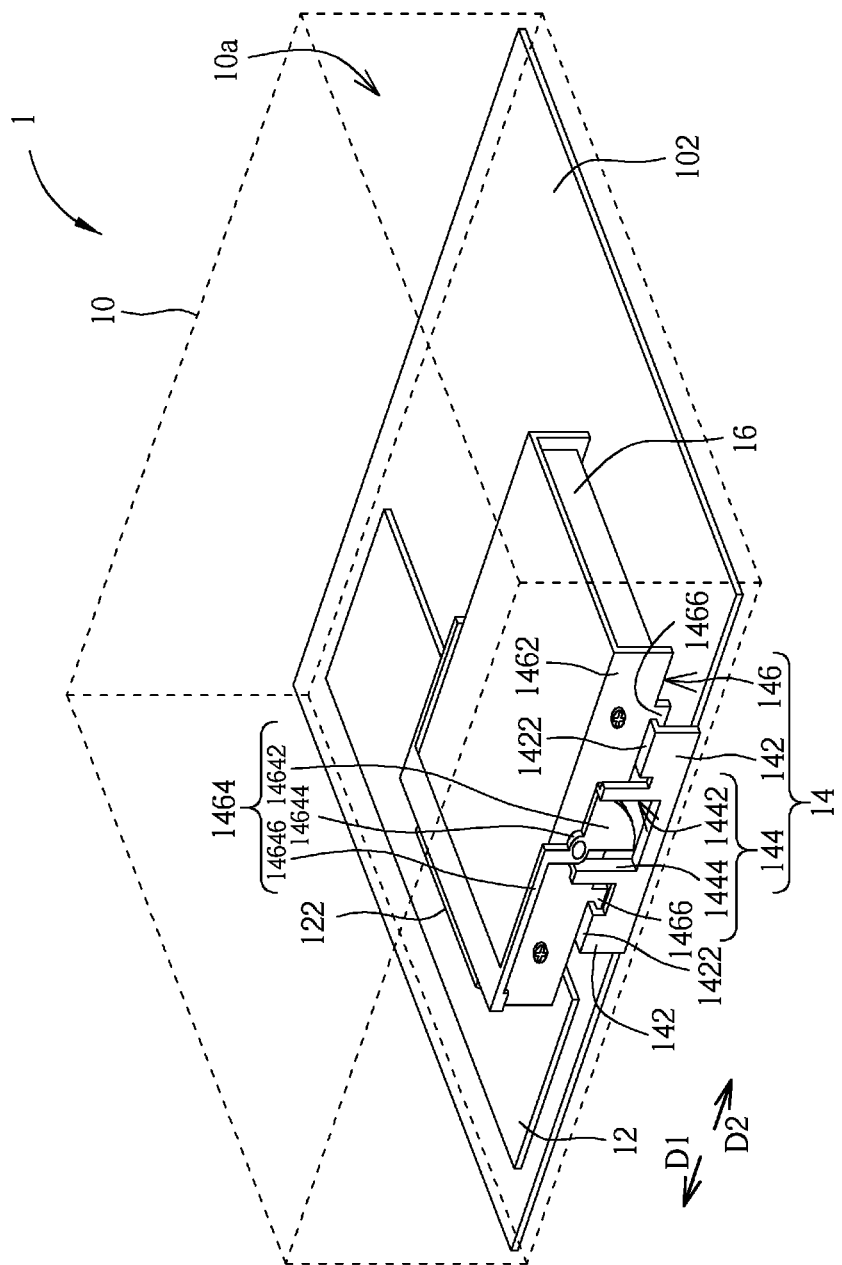
FIG. 1 is a schematic diagram illustrating an electronic apparatus of an embodiment according to the disclosure.

Please refer to FIG. 1, which is a schematic diagram illustrating an electronic apparatus 1 of an embodiment according to the disclosure. The electronic apparatus 1 is but not limited to a computer host and includes an apparatus casing 10, a circuit module 12, and an installation mechanism 14. For simplification of the drawing, the apparatus casing 10 is shown with its profile in dashed lines. The apparatus casing 10 has an accommodating space 10a for accommodating other components. The apparatus casing 10 includes a plate part 102, for disposing other components thereon, in the accommodating space 10a. The circuit module 12 is fixed on the plate part 102. The installation mechanism 14 is used for removably installing a replaceable device 16 such as, but not limited to, a hard drive to the apparatus casing 10, so that the replaceable device 16 is electrically connected to the circuit module 12. The installation mechanism 14 includes a supporting structure 142, an abutting structure 144, and a removable carrier 146. The supporting structure 142 and the abutting structure 144 are disposed in the accommodating space 10a and fixed on the plate part 102. Thereby, a user can make the replaceable device 16, carried on the removable carrier 146, and the circuit module 12 engaged with or disengaged from each other by the interaction of the removable carrier 146 with the supporting structure 142 and the abutting structure 144.

Figure 2:
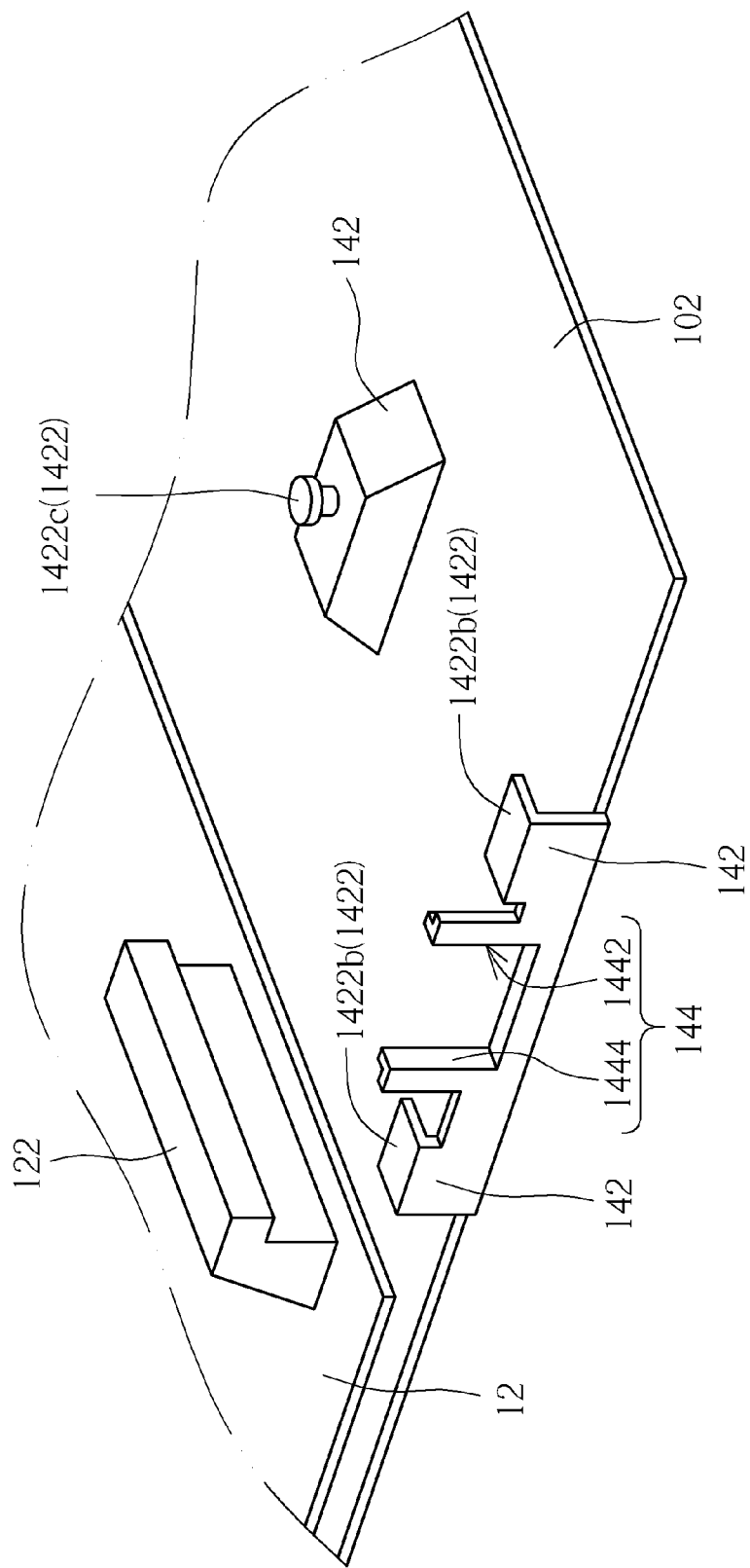
FIG. 2 is a schematic diagram illustrating the supporting structure and the abutting structure in FIG. 1.
Figure 3:
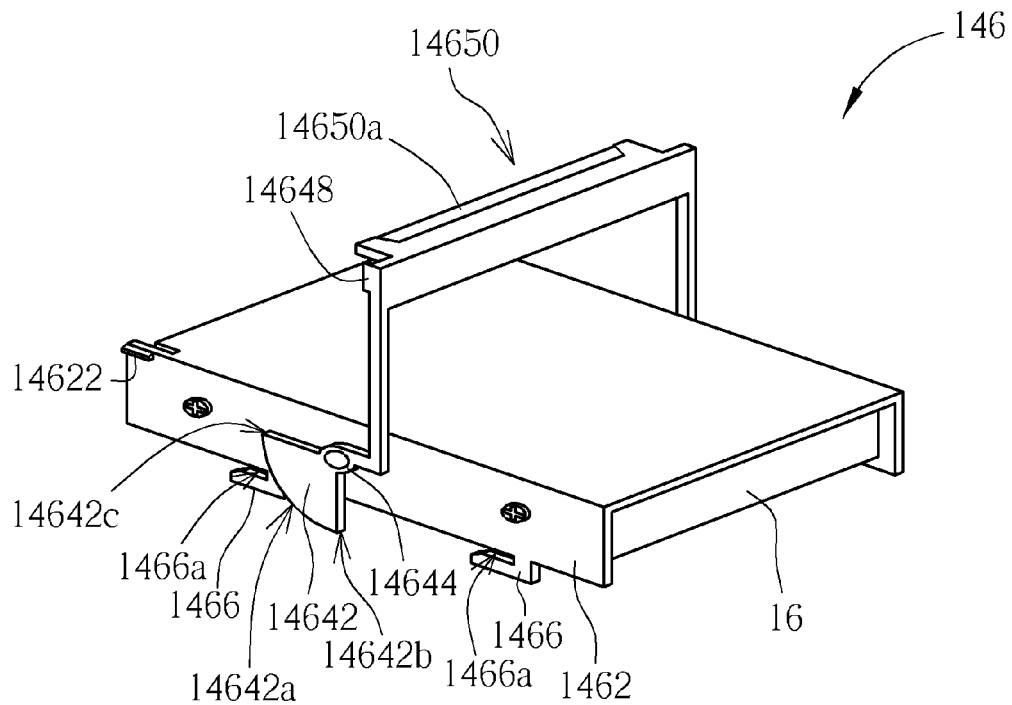
FIG. 3 is a schematic diagram illustrating the removable carrier in FIG. 1.
Figure 4:
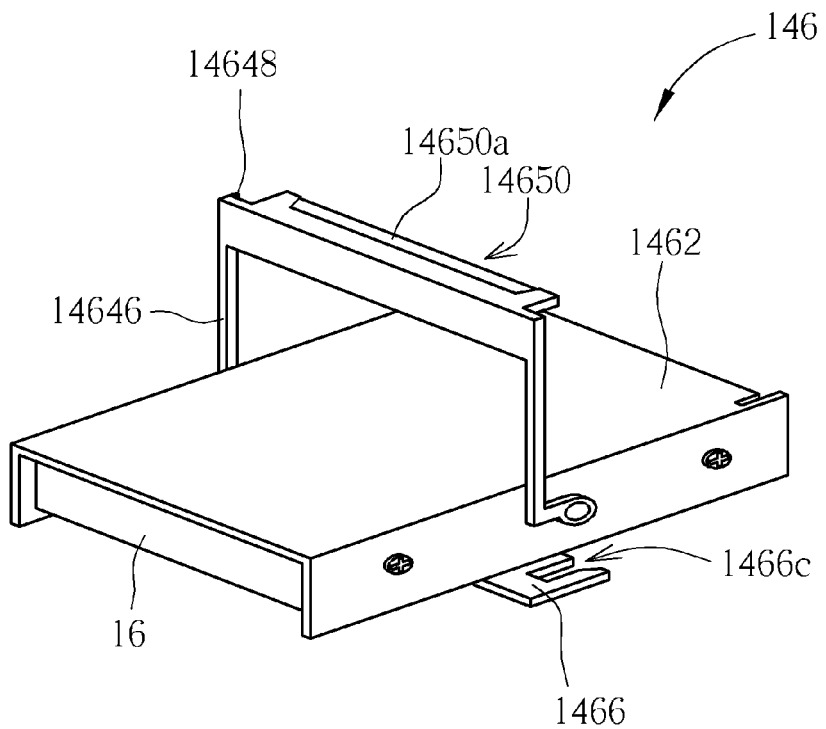
FIG. 4 is another view of the removable carrier.

Please also refer to FIGS. 2 to 4. FIG. 2 is a schematic diagram illustrating the supporting structure 142 and the abutting structure 144. FIG. 3 is a schematic diagram illustrating the removable carrier 146. FIG. 4 is another view of the removable carrier 146. Furthermore, the replaceable device 16 includes a first connector 162 for being electrically connected to the circuit module 12. The circuit module 12 includes a second connector 122 disposed in the accommodating space 10a and used for being electrically connected to the replaceable device 16. The supporting structure 142 includes a first sliding engagement structure 1422. The abutting structure 144 has a first side wall 1442 and a second side wall 1444 oppositely disposed. The removable carrier 146 includes a fixing frame 1462 and an actuation part 1464. The replaceable device 16 is fixed on the fixing frame 1462. The actuation part 1464 includes a sliding portion 14642, a pivotal connection portion 14644, and a manipulation portion 14646. The actuation part 1464 is connected to the fixing frame 1462 through the pivotal connection portion 14644. The sliding portion 14642 and the manipulation portion 14646 are connected to the pivotal connection portion 14644 oppositely. When the fixing frame 1462 is supported by the supporting structure 142, the sliding portion 14642 is slidably disposed in the abutting structure 144 (i.e. between the first side wall 1442 and the second side wall 1444). The user can use the manipulation portion 14646 to rotate the actuation part 1464 relative to the fixing frame 1462 so that the sliding portion 14642 abuts against and slides on the first side wall 1442 or the second side wall 1444. Under the reaction force of the first side wall 1442 and the second side wall 1444 to the sliding portion 14642, the fixing frame 1462 moves relative to the supporting structure 142 through the first sliding engagement structure 1422 for the purpose of the replaceable device 16 being engaged with and disengaged from the circuit module respectively.

Furthermore, in the embodiment, the removable carrier 146 includes a second sliding engagement structure 1466, disposed on the fixing frame 1462 and capable of sliding to engage with the first sliding engagement structure 1422. Therefore, the fixing frame 1462 can smoothly slide on the supporting structure 142 through the first sliding engagement structure 1422 and the second sliding engagement structure 1466. Therein, the first sliding engagement structure 1422 includes two plate structures 1422a and 1422b and a guiding and positioning block 1422c. The second sliding engagement structure 1466 includes two slots 1466a and 1466b and a sliding slot 1466c. The slots 1466a and 1466b and the sliding slot 1466c are disposed at two opposites of the fixing frame 1462. Thereby, the first sliding engagement structure 1422 and the second sliding engagement structure 1466 are engaged with other by the plate structures 1422a and 1422b relatively moving in the slots 1466a and 1466b correspondingly and the guiding and positioning block 1422c relatively moving in the sliding slot 1466c.

In addition, it is added that in the embodiment, the abutting structure 144 and the plate structures 1422a and 1422b of the first sliding engagement structure 1422 are formed substantially by a side wall extending and bending from an edge of the plate part 102, i.e. integrally formed with the plate part 102; however, the disclosure is not limited. Furthermore, in the embodiment, the abutting structure 144 is an indentation structure of the side wall, but the disclosure is not limited thereto.

Figure 5:
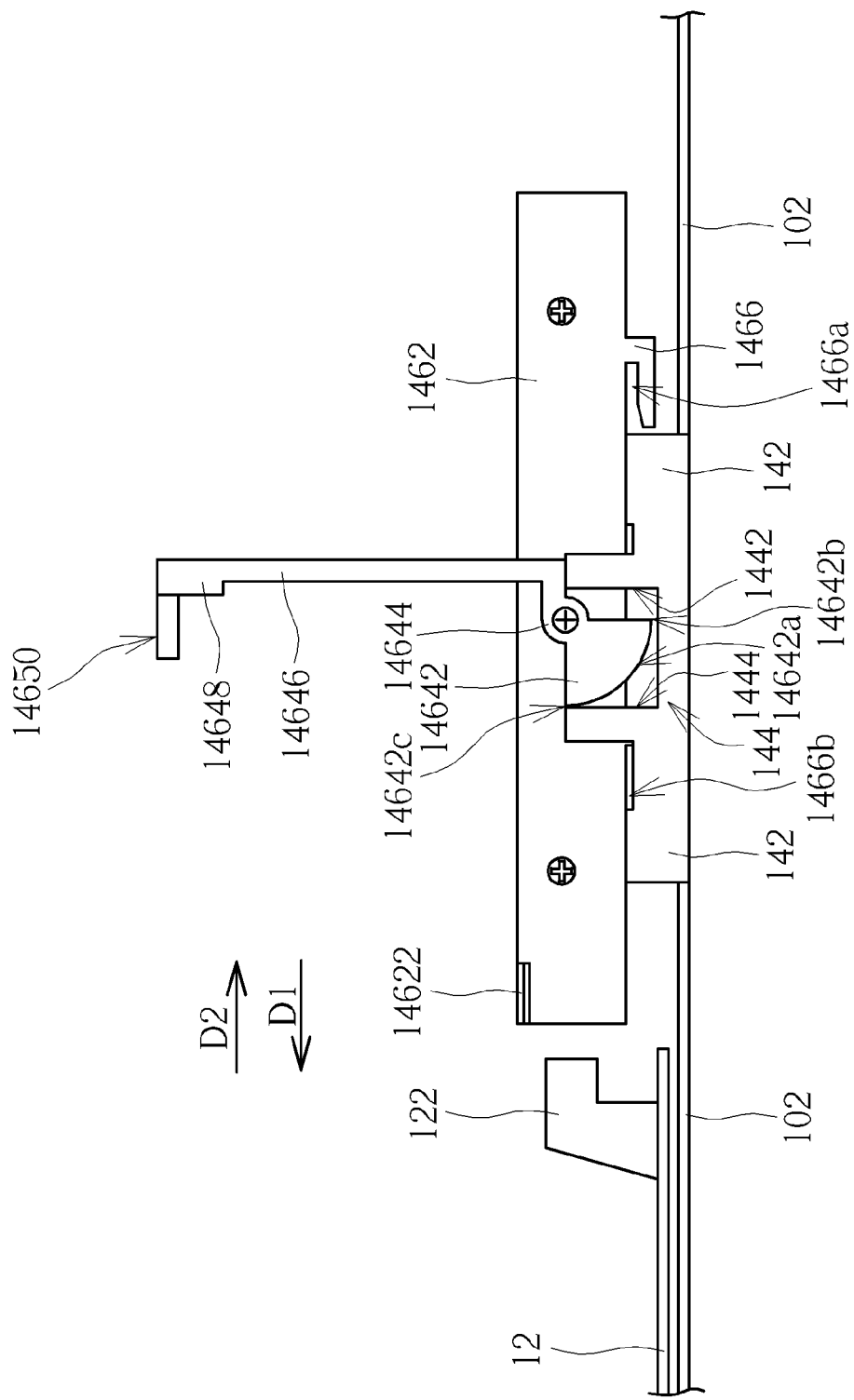
FIG. 5 is a side view of the replaceable device and the circuit module before engaged.
Figure 6:
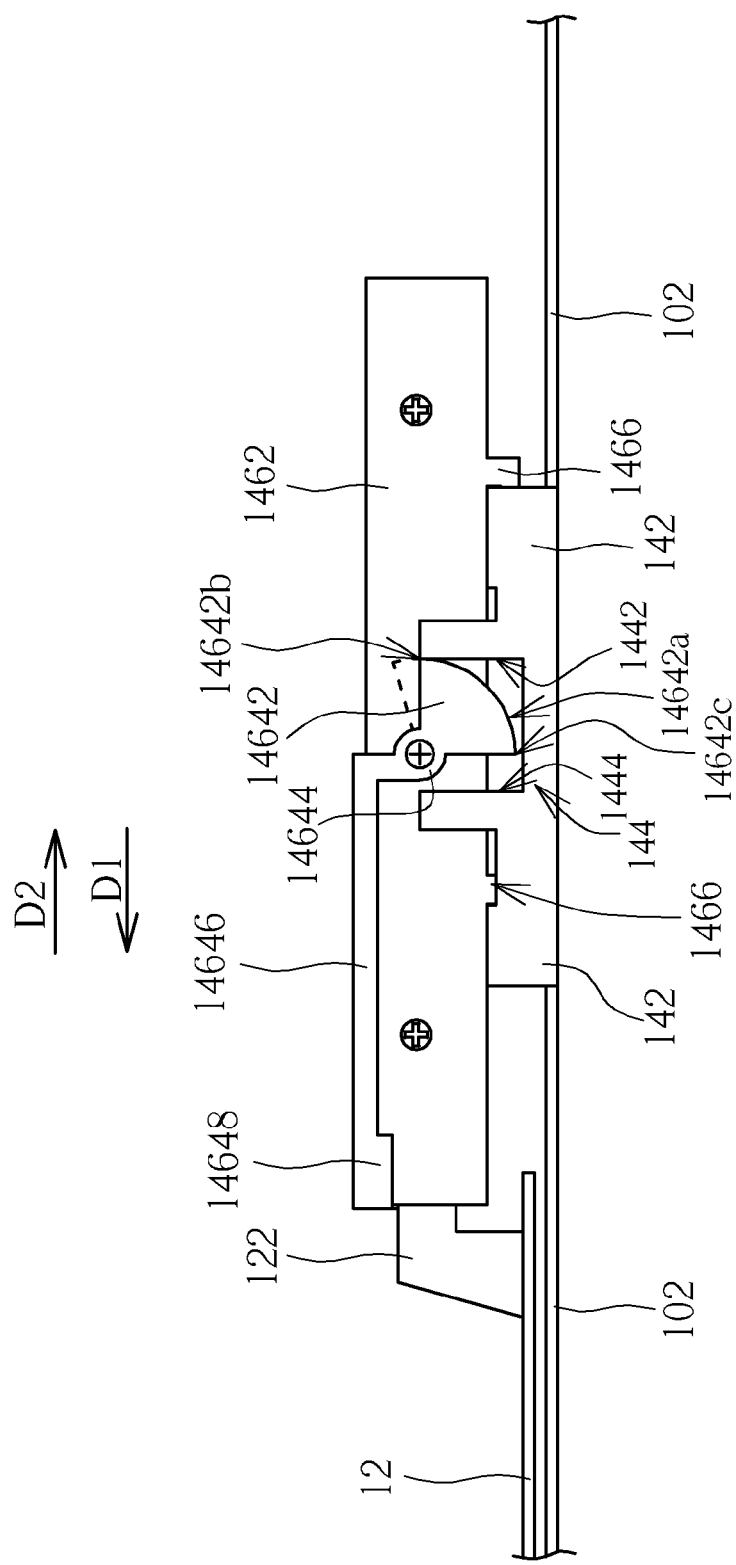
FIG. 6 is a side view of the replaceable device and the circuit module after engaged.
Figure 7:
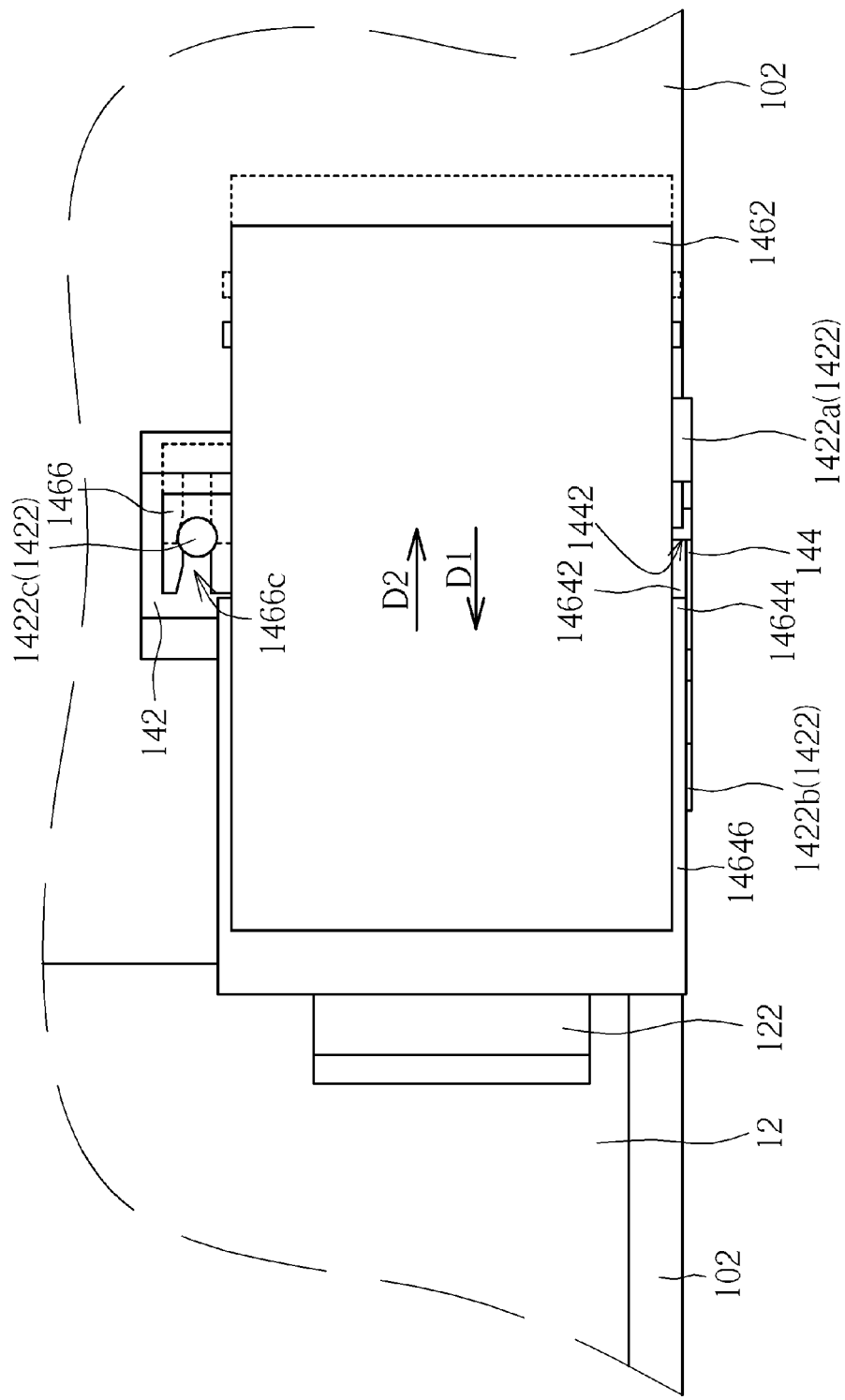
FIG. 7 is a top view of the replaceable device engaged with the circuit module by using the removable carrier.

Please also refer to FIGS. 5 to 7. FIG. 5 and FIG. 6 are side views of installing the replaceable device 16 into the apparatus casing 10 through the removable carrier 146. FIG. 7 is a top view of the replaceable device 16 engaged with the circuit module 12 by using the removable carrier 146; therein, the removable carrier 146 is shown with its profile in dashed lines when the replaceable device 16 is not engaged with the circuit module 12 yet. When the replaceable device 16 needs to be installed in the apparatus casing 10, the replaceable device 16 is fixed onto the fixing frame 1462 of the removable carrier 146 in advance, for example by screws or other fixing methods. Then, the user can put the removable carrier 146 on the supporting structure 142, so that the sliding portion 14642 of the actuation part 1464 is located in the abutting structure 144, as shown by FIG. 5. Afterwards, the user can manipulate the manipulation portion 14646 to rotate the actuation part 1464 relative to the fixing frame 1462, so that the sliding portion 14642 slides against the first side wall 1442 so that the fixing frame 1462 slides on the supporting structure 142 in a first direction D1 (indicated by an arrow in FIGS. 1 and 5 to 7) through the first sliding engagement structure 1422 leading to an engagement of the first connector 162 with the second connector 122, as shown by FIG. 6. Therein, when the fixing frame 1462 slides on the supporting structure 142 in the first direction D1, the second sliding engagement structure 1466 and the first sliding engagement structure 1422 relatively slide parallel to the first direction D1 to engage with each other, so that the first connector 162 and the second connector 122 are engaged with each other. The installation of the replaceable device 16 is complete in substance.

When the replaceable device 16 needs to be detached from the apparatus casing 10, similarly, the user can manipulate the manipulation portion 14646 to rotate the actuation part 1464 relative to the fixing frame 1462, so that the sliding portion 14642 slides against the second side wall 1444 so that the fixing frame 1462 slides on the supporting structure 142 in a second direction D2 ( )(indicated by an arrow in FIGS. 1, 5 and 6) through the first sliding engagement structure 1422 until the second sliding engagement structure 1466 is disengaged from the first sliding engagement structure 1422 leading to an disengagement of the first connector 162 from the second connector 122, as shown by FIG. 5. Therein, the second direction D2 is opposite to the first direction D1. When the fixing frame 1462 slides on the supporting structure 142 in the second direction D2, the second sliding engagement structure 1466 and the first sliding engagement structure 1422 relatively slide parallel to the second direction D2 to disengage from each other, so that the first connector 162 and the second connector 122 are disengaged from each other. Afterward, the user can directly remove the removable carrier 146 from the supporting structure 142 out of the apparatus casing 10. The detachment of the replaceable device 16 is complete in substance.

It is added that in the embodiment, the sliding portion 14642 substantially shows a circular sector profile having an arc edge 14642*a*. The sliding portion 14642 slides against the first side wall 1442 and the second side wall 1444 through the arc edge 14642*a*. During the manipulation of the actuation part 1464 for the first connector 162 and the second connector 122 to engage with or disengage from each other, the sliding portion 14642 remains located in the abutting structure 144. For more details, in the embodiment, the sliding portion 14642 slides against the first side wall 1442 through an end 14642*b* of the arc edge 14642*a* and slides against the second side wall 1444 through another end 14642*c* of the arc edge 14642*a*. Furthermore, in the embodiment, the pivot axis (indicated by a cross mark in FIG. 5 and FIG. 6) where the pivotal connection portion 14644 with the fixing frame 1462 are pivotally connected is located at the center of the circular sector profile, of which an angle included by the radii is 90 degrees. When the first connector 162 and the second connector 122 are engaged completely, the manipulation portion 14646 is located against the fixing frame 1462 (or the manipulation portion 14646 being adjacent to the fixing frame 1462) and the end 14642*b* of the arc edge 14642*a* and the pivot axis are located at the same level (i.e. the end 14642*b* being located at the right side of the pivot axis). When the first connector 162 and the second connector 122 are disengaged completely, the manipulation portion 14646 is far away from the fixing frame 1462 and the end 14642*c* of the arc edge 14642*a* and the pivot axis are located at the same level (i.e. the end 14642*c* being located at the left side of the pivot axis). However, the disclosure is not limited thereto. For example, in practice, it is practicable to use a sliding portion with other geometric profile, or to use the sliding portion 14642 having a circular sector profile with an angle, included by the radii, larger than 90 degrees (as shown by the dashed lines in FIG. 6). For the latter case, in the last stage of the arc edge 14642*a* sliding on the first side wall 1442, because the center of the circular sector profile is located at the pivot axis where the pivotal connection portion 14644 with the fixing frame 1462 are pivotally connected, the fixing frame 1462 will not move relative to the supporting structure 142 anymore. Such feature is conducive to keeping the distance between the first connector 162 and the second connector 122 fixed (or keeping the relative position of the first connector 162 and the second connector 122 fixed after they are engaged), avoiding damage to the first connector 162 and the second connector 122 by an impact of the first connector 162 to the second connector 122 due to an excessive rotation of the actuation part 1464.

It is added that, in the embodiment, the actuation part 1464 as a whole shows an n-shaped structure and is pivotally connected to two opposite sides of the fixing frame 1462, which is conducive to carrying the removable carrier 146 (and the replaceable device 16 fixed thereon) through the actuation part 1464 by the user; however, the disclosure is not limited thereto. In addition, in the embodiment, the sliding portion 14642 and the abutting structure 144 of the fixing frame 1462 are only disposed at one side of the fixing frame 1462, but the disclosure is not limited thereto. For example, the sliding portion 14642 and the abutting structure 144 can be disposed at each of the opposite sides of the fixing frame 1462, which is conducive to the sliding stability of the fixing frame 1462 relative to the supporting structure 142 and the engagement stability of the first connector 162 with the second connector 122.

As discussed above, after the replaceable device 16 is installed in the apparatus casing 10 through the removable carrier 146, the manipulation portion 14646 of the actuation part 1464 is located against the fixing frame 1462. In the embodiment, the actuation part 1464 further includes a first snap structure 14648 disposed on the manipulation portion 14646; correspondingly, the fixing frame includes a second snap structure 14622. When the removable carrier 146 is supported by the supporting structure 142 and the actuation part 1464 rotates relative to the fixing frame 1462 until the manipulation portion 14646 reaches the fixing frame 1462, the first snap structure 14648 and the second snap structure 14622 are locked with each other so that the actuation part 1464 is fixed and avoids rotating relative to the fixing frame 1462 unexpectedly. In the embodiment, the first snap structure 14648 is a hook; the second snap structure 14622 a hook formed by protruding an edge of a side wall of the fixing frame 1462. However, the disclosure is not limited thereto. For example, a pair of a hook and a slot or a pair of a hole (or recess) and a protruding structure also can carry out the first snap structure and the second snap structure of the disclosure.

Figure 8:
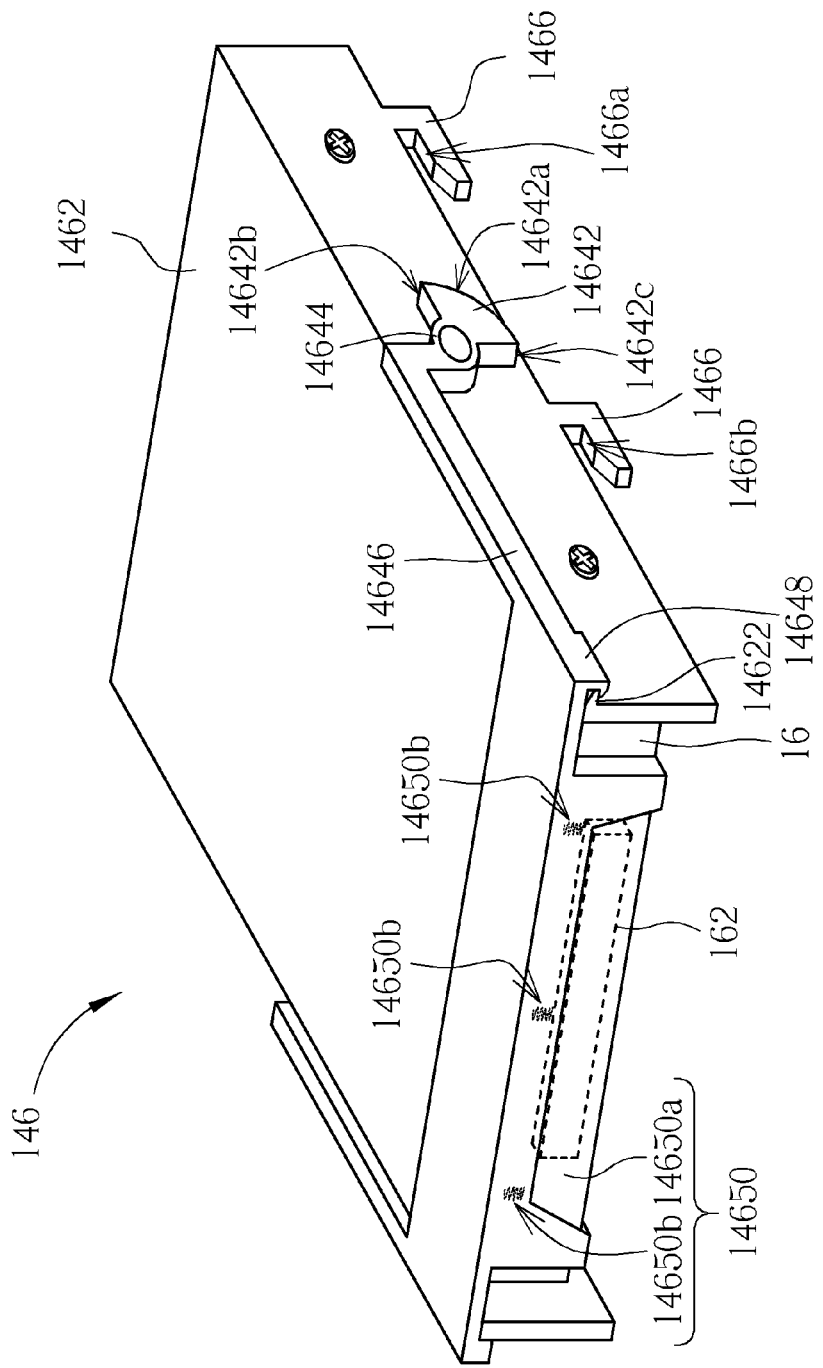
FIG. 8 is a schematic diagram illustrating the removable carrier when the manipulation portion is located against the fixing frame.
Figure 9:
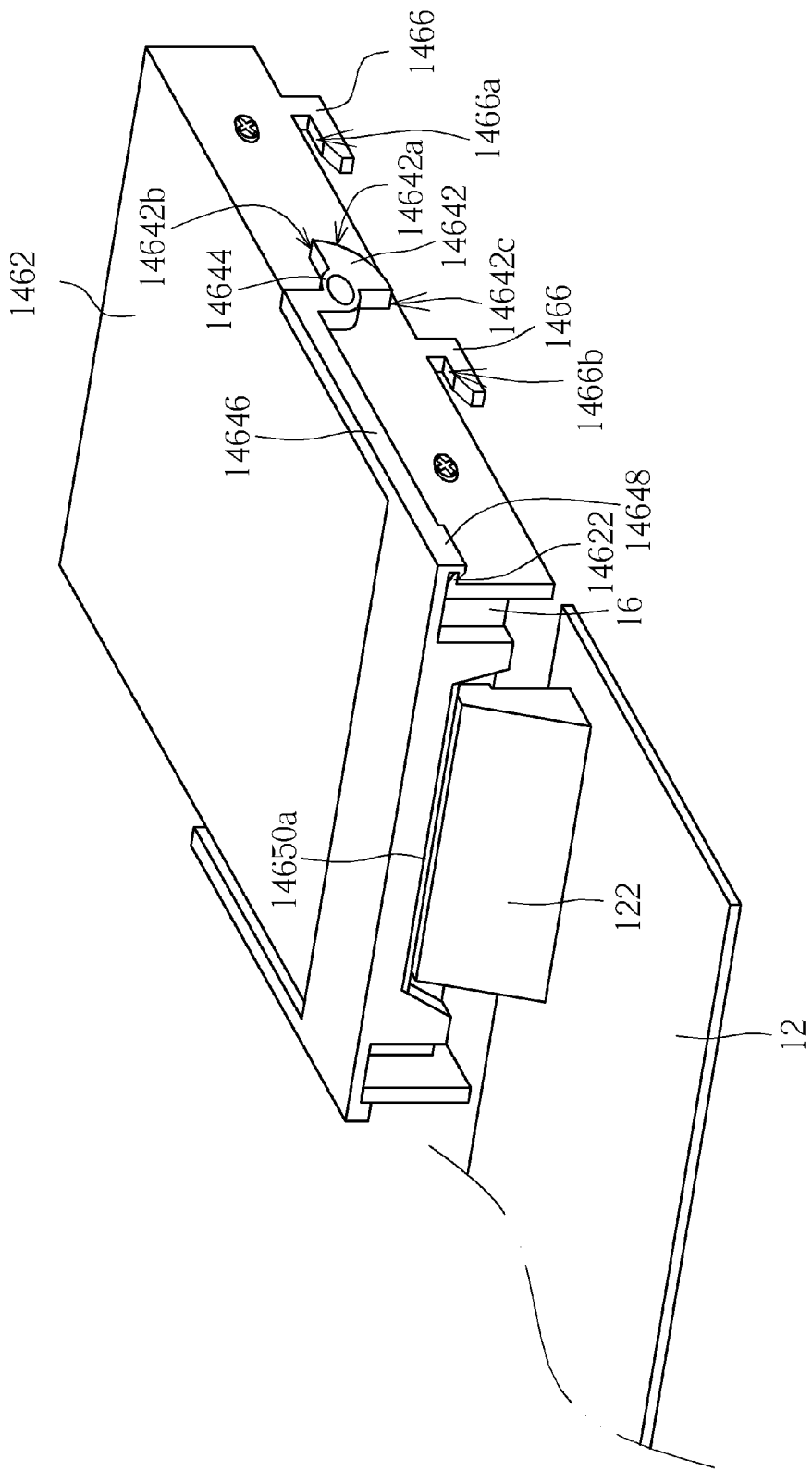
FIG. 9 is a schematic diagram illustrating the removable carrier when the replaceable device is installed.

In addition, please refer to FIG. 8 and FIG. 9. FIG. 8 is a schematic diagram illustrating the manipulation portion 14646 is located against the fixing frame 1462 when the removable carrier 146 is not supported on the supporting structure 142. FIG. 9 is a schematic diagram illustrating the removable carrier 146 when the first connector 162 and the second connector 122 are engaged. In the embodiment, the actuation part 1464 includes a protection cover mechanism 14650 disposed on the manipulation portion 14646. The protection cover mechanism 14650 includes a protection cover 14650*a* and a resilient portion 14650*b* (for example but not limited to three springs shown by dashed lines in FIG. 8). The resilient portion 14650*b* is disposed on the manipulation portion 14646 and abuts against the protection cover 14650*a* so that the protection cover 14650*a* is retractably disposed on the manipulation portion 14646. When the removable carrier 146 is departed from the supporting structure 142 and the actuation part 1464 rotates relative to the fixing frame 1462 until the manipulation portion 14646 reaches the fixing frame 1462, the protection cover 14650*a* covers the first connector 162, as shown by FIG. 8. Such feature make the removable carrier 146 protect the first connector 162 when the replaceable device 16 is not installed to the electronic apparatus 1 yet. When the removable carrier 146 is supported by the supporting structure 142 and the actuation part 1464 rotates relative to the fixing frame 1462 until the manipulation portion 14646 reaches the fixing frame 1462, the protection cover 14650a is pushed by the second connector 122 and retract (to compress the resilient portion 14650b) so that the first connector 162 is engaged with the second connector 122 without any interference from the protection cover 14650a, as shown by FIG. 9. Afterward, when the actuation part 1464 rotates relative to the fixing frame 1462 again, the resilient force stored in the compressed resilient portion 14650b will drive the protection cover 14650a to extend to its original position.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An installation mechanism for removably installing a replaceable device to an apparatus casing, the installation mechanism comprising:
   a supporting structure disposed in the apparatus casing, the supporting structure comprising a first sliding engagement structure;
   an abutting structure disposed in the apparatus casing, the abutting structure having a first side wall and a second side wall oppositely disposed; and
   a removable carrier comprising a fixing frame and an actuation part, the replaceable device being fixed on the fixing frame, the actuation part comprising a sliding portion, a pivotal connection portion, and a manipulation portion, the actuation part being connected to the fixing frame through the pivotal connection portion, the manipulation portion being operable to rotate the actuation part relative to the fixing frame so that the sliding portion alternatively slides against the first side wall without contacting the second side wall in order that the fixing frame slides on the supporting structure in a first direction through the first sliding engagement structure, or slides against the second side wall without contacting the first side wall in order that the fixing frame slides on the supporting structure in a second direction, parallel to the first direction, through the first sliding engagement structure.

2. The installation mechanism of claim 1, wherein the sliding portion substantially shows a circular sector profile having an arc edge, and the sliding portion slides against the first side wall and the second side wall through the arc edge.

3. The installation mechanism of claim 1, wherein the removable carrier comprises a second sliding engagement structure disposed on the fixing frame and capable of slidably engaging with the first sliding engagement structure parallel to the first direction, when the fixing frame slides over the supporting structure in the first direction, the second sliding engagement structure is engaged with the first sliding engagement structure, and when the fixing frame slides over the supporting structure in the second direction, the second sliding engagement structure is disengaged from the first sliding engagement structure.

4. The installation mechanism of claim 3, wherein the first sliding engagement structure comprises a plate structure, the second sliding engagement structure comprises a slot, and the first sliding engagement structure and the second sliding engagement structure are engaged by the plate structure relatively sliding into the slot.

5. The installation mechanism of claim 3, wherein the first sliding engagement structure comprises a guiding and positioning block, the second sliding engagement structure comprises a sliding slot, and the first sliding engagement structure and the second sliding engagement structure are engaged by the guiding and positioning block relatively sliding into the sliding slot.

6. The installation mechanism of claim 1, wherein the actuation part comprises a first snap structure disposed on the manipulation portion, the fixing frame comprises a second snap structure, and when the actuation part rotates relative to the fixing frame until the manipulation portion reaches the fixing frame, the first snap structure and the second snap structure are locked with each other.

7. The installation mechanism of claim 1, the replaceable device comprising a first connector, wherein the actuation part comprises a protection cover mechanism disposed on the manipulation portion, the protection cover mechanism comprises a protection cover, and when the removable carrier is disengaged from the supporting structure and the actuation part rotates relative to the fixing frame until the manipulation portion reaches the fixing frame, the protection cover covers the first connector.

8. The installation mechanism of claim 7, a second connector being disposed in the apparatus casing, wherein the protection cover is retractably disposed on the manipulation portion, the protection cover mechanism comprises a resilient portion, the resilient portion is disposed on the manipulation portion and abuts against the protection cover, and when the removable carrier is supported by the supporting structure and the actuation part rotates relative to the fixing frame until the manipulation portion reaches the fixing frame, the protection cover is pushed by the second connector and retracts so that the first connector is engaged with the second connector.

9. The installation mechanism of claim 1, wherein the second direction is opposite to the first direction.

10. An electronic apparatus, comprising:
    a replaceable device comprising a first connector;
    an apparatus casing having an accommodating space;
    a second connector disposed in the accommodating space;
    a supporting structure disposed in the accommodating space, the supporting structure comprising a first sliding engagement structure;
    an abutting structure disposed in the accommodating space, the abutting structure having a first side wall and a second side wall oppositely disposed; and
    a removable carrier comprising a fixing frame and an actuation part, the replaceable device being fixed on the fixing frame, the actuation part comprising a sliding portion, a pivotal connection portion, and a manipulation portion, the actuation part being connected to the fixing frame through the pivotal connection portion, the manipulation portion being operable to rotate the actuation part relative to the fixing frame so that the sliding portion alternatively slides against the first side wall without contacting the second side wall in order that the fixing frame slides on the supporting structure in a first direction through the first sliding engagement structure and the first connector is engaged with the second connector, or slides against the second side wall without contacting the first side wall in order that the fixing frame slides on the supporting structure in a second direction, parallel to the first direction, through the first sliding engagement structure and the first connector is disengaged from the second connector.

11. The electronic apparatus of claim 10, wherein the sliding portion substantially shows a circular sector profile having an arc edge, and the sliding portion slides against the first side wall and the second side wall through the arc edge.

12. The electronic apparatus of claim 10, wherein the removable carrier comprises a second sliding engagement structure disposed on the fixing frame and capable of slidably engaging with the first sliding engagement structure parallel to the first direction, when the fixing frame slides over the supporting structure in the first direction, the second sliding engagement structure is engaged with the first sliding engagement structure so that the first connector is engaged with the second connector, and when the fixing frame slides over the supporting structure in the second direction, the second sliding engagement structure is disengaged from the first sliding engagement structure so that the first connector is disengaged from the second connector.

13. The electronic apparatus of claim 12, wherein the first sliding engagement structure comprises a plate structure, the second sliding engagement structure comprises a slot, and the first sliding engagement structure and the second sliding engagement structure are engaged by the plate structure relatively sliding into the slot.

14. The electronic apparatus of claim 12, wherein the first sliding engagement structure comprises a guiding and positioning block, the second sliding engagement structure comprises a sliding slot, and the first sliding engagement structure and the second sliding engagement structure are engaged by the guiding and positioning block relatively sliding into the sliding slot.

15. The electronic apparatus of claim 10, wherein the actuation part comprises a first snap structure disposed on the manipulation portion, the fixing frame comprises a second snap structure, and when the actuation part rotates relative to the fixing frame until the manipulation portion reaches the fixing frame, the first snap structure and the second snap structure are locked with each other.

16. The electronic apparatus of claim 10, wherein the actuation part comprises a protection cover mechanism disposed on the manipulation portion, the protection cover mechanism comprises a protection cover, and when the removable carrier is disengaged from the supporting structure and the actuation part rotates relative to the fixing frame until the manipulation portion reaches the fixing frame, the protection cover covers the first connector.

17. The electronic apparatus of claim 16, wherein the protection cover is retractably disposed on the manipulation portion, the protection cover mechanism comprises a resilient portion, the resilient portion is disposed on the manipulation portion and abuts against the protection cover, and when the removable carrier is supported by the supporting structure and the actuation part rotates relative to the fixing frame until the manipulation portion reaches the fixing frame, the protection cover is pushed by the second connector and retracts so that the first connector is engaged with the second connector.

18. The electronic apparatus of claim 10, wherein the second direction is opposite to the first direction.

* * * * *